US005193117A

United States Patent [19]

Ono et al.

[11] Patent Number: 5,193,117

[45] Date of Patent: Mar. 9, 1993

[54] MICROPHONE APPARATUS

[75] Inventors: Kiminori Ono, Katano; Michio Matsumoto, Sennan; Hiroyuki Naono, Yawata; Hiroshi Kobayashi, Moriguchi; Yuuji Yamashina, Takatsuki, all of Japan

[73] Assignee: Matsushita Electric Industrial Co., Ltd., Osaka, Japan

[21] Appl. No.: 612,145

[22] Filed: Nov. 13, 1990

[30] Foreign Application Priority Data

Nov. 27, 1989 [JP] Japan ................................ 1-307036

[51] Int. Cl.[5] ............................................ H03B 29/00

[52] U.S. Cl. ............................................ 381/71; 381/92; 381/94

[58] Field of Search ...................... 381/71, 92, 94, 26; 367/123, 126, 121

[56] References Cited

U.S. PATENT DOCUMENTS 4,703,506 10/1987 Sakamoto et al. .................... 381/92

FOREIGN PATENT DOCUMENTS 64-39194 2/1989 Japan .
64-39195 2/1989 Japan .

*Primary Examiner*—Jin F. Ng
*Assistant Examiner*—Edward Lefkowitz
*Attorney, Agent, or Firm*—Wenderoth, Lind & Ponack

[57] ABSTRACT

A microphone apparatus using two microphones has a circuit for processing output signals of the two microphones so as to obtain non-directional characteristics in a low frequency region and uni-directional characteristics in a high frequency region. When this microphone apparatus is incorporated in an appliance containing an acoustic noise source and vibration source therein, acoustic noise, vibration noise and wind noise are reduced to prevent a reduction of the S/N ratio when picking up the sound, so that the recording of an excellent quality sound can be realized.

1 Claim, 5 Drawing Sheets

MICROPHONE APPARATUS

BACKGROUND OF THE INVENTION

1. Field of the Invention

The present invention relates to a microphone apparatus to be built into an appliance possessing an acoustic noise source or a vibration source therein.

2. Description of the Prior Art

In the collection of sound using a microphone, the quality of the sound signal deteriorates due to acoustic noise other than the desired sound, vibration noise caused by mechanical vibration and wind noise caused by wind. In particular, in an appliance such as a as video camera, not only does the mechanical system contained therein generate acoustic noise and vibration, but also the appliance itself is often used outdoors. When incorporating a directional microphone or a non-directional microphone in such an appliance, the S/N ratio of the sound collection drops owing to the following factors.

Since the microphone is close to the vibration source or acoustic noise source, the absolute level of the acoustic noise or vibration applied to the microphone increases.

Since the microphone is close to the acoustic noise source, a proximity effect occurs in a directional microphone, and the pressure sensitivity is raised in the front and rear directions thereof in the low frequency region so as to make it susceptible to the acoustic noise generated by the mechanical system.

The directional microphone is more liable to be influenced by vibrations than the non-directional microphone.

The directional microphone is more liable to be influenced by the wind than the non-directional microphone.

The non-directional microphone cannot eliminate acoustic noise by directivity.

A microphone apparatus having a function for reducing the wind noise has already been proposed (for example, see Japanese patent publication Nos. H01-39194 and H01-39195). The microphone apparatus comprises a non-directional microphone, a uni-directional microphone, a low pass filter for removing the high frequency components of the output signal of the non-directional microphone, a high pass filter for removing the low frequency components of the output signal of the uni-directional microphone, an adder for adding the outputs of the two filters, and a means for detecting the intensity of the wind noise.

In the thus composed microphone apparatus, by detecting the intensity of the wind noise, the wind noise is reduced by deriving the output signal of the uni-directional microphone when the wind is weak, and the combined signal of the high frequency components of the output signal of the uni-directional microphone and the low frequency components of the output signal of the non-directional microphone when the wind is strong.

In such a conventional microphone apparatus, however, although the wind noise can be reduced, if the apparatus is built into an appliance having a noise or vibration source, it is impossible to reduce the acoustic noise from increasing due to the proximity effect and mechanical vibration when the wind is weak.

SUMMARY OF THE INVENTION

It is hence a primary object of the invention to provide a microphone apparatus capable of reducing the wind noise and the acoustic and vibration noise generated by a mechanical system of an appliance in which the microphone apparatus is incorporated, and for preventing a preventing reduction of the S/N ratio of the sound collection.

To achieve the above object, a microphone apparatus of the invention comprises two microphones, and a signal processing means for processing output signals of the microphones so that the directional characteristic becomes non-directional in a low frequency region and uni-directional in a high frequency region.

In this constitution, the microphone apparatus of the present invention can reduce the wind noise and the acoustic and vibration noise generated by a mechanical system of an appliance in which the microphone apparatus is incorporated, and hence prevent reduction of the S/N ratio when collecting sound.

DESCRIPTION OF THE PREFERRED EMBODIMENTS

Figure 1:
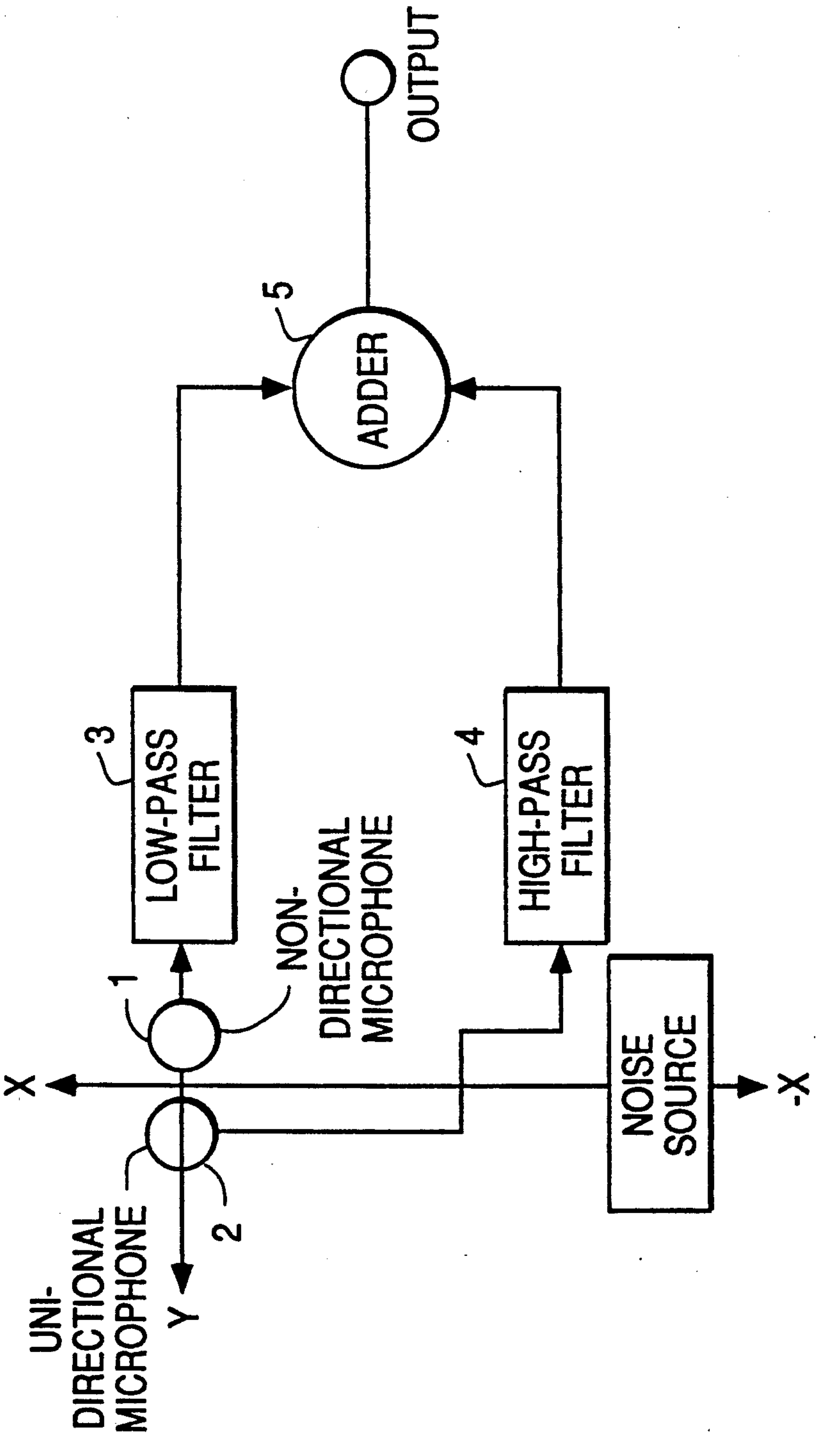
FIG. 1 is a block diagram showing a microphone apparatus in accordance with an embodiment of the present invention.

Referring now to the drawing, some of the embodiments of the invention are described in detail below.

FIG. 1 is a block diagram of a microphone apparatus in accordance with an embodiment of the invention. In the following explanation, the acoustic noise source and vibration source both refer to the mechanical system contained in an appliance in which the microphone apparatus is incorporated. In FIG. 1, the X-direction is referred to as a "front direction", and the -X direction is referred to as a "rear direction", and the Y-direction as "side direction". More specifically in FIG. 1, element 1 is a non-directional microphone; element 2 is a uni-directional microphone disposed adjacent to the non-directional microphone 1 with its main axis directed in the front direction; element 3 is a low-pass filter for removing high frequency components of an output signal of the non-directional microphone 1; element 4 is a high-pass filter for removing low frequency components of an output signal of the uni-directional microphone 2, and element 5 is an adder for adding output signals of the low-pass filter 3 and high-pass filter 4.

In the thus composed microphone apparatus, the operation is as follows.

The wind noise is concentrated in the low frequency region, and the uni-directional microphone is more susceptible to the effect of wind than the non-directional microphone. As for the mechanical vibration, too, the uni-directional microphone is more liable to be influenced than the non-directional microphone, and such tendency will be more significant when the vibration frequency is lower. Furthermore, near a sound source, the pressure sensitivity in the front direction and rear direction of the uni-directional microphone is raised in the low frequency region (proximity effect).

Figure 2:
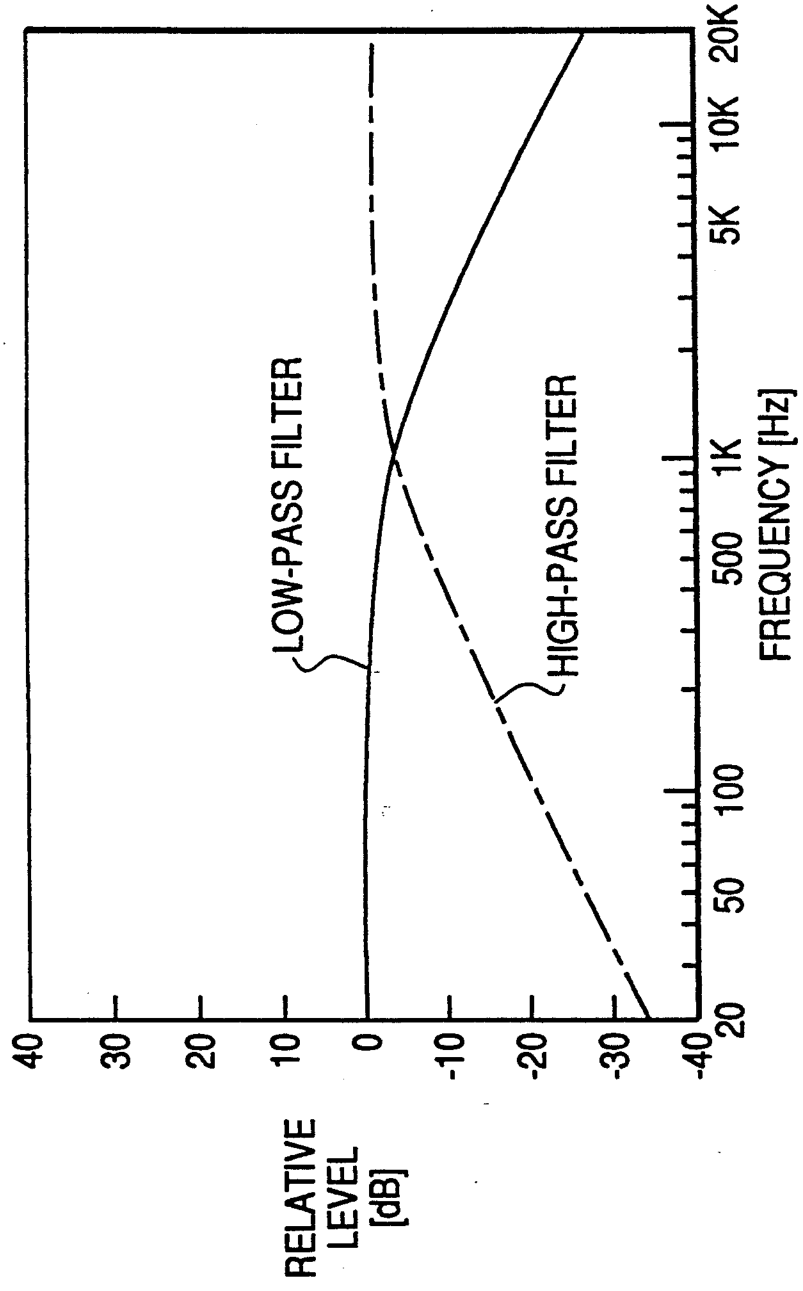
FIG. 2 is a diagram showing frequency responses of filters in the microphone apparatus of FIG. 1.
Figure 3:
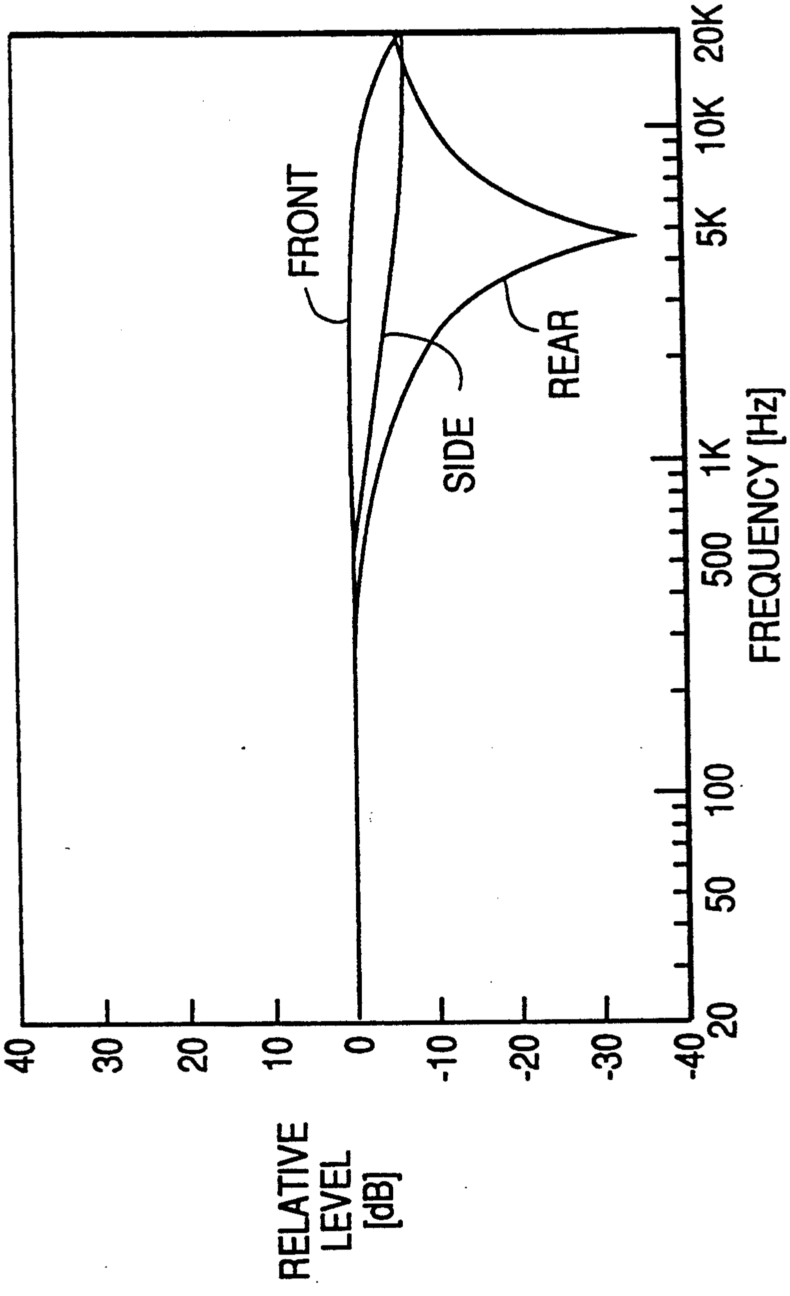
FIG. 3 is a diagram showing a frequency response of the microphone apparatus of FIG. 1.

The high frequency components of the output signal of the non-directional microphone 1 are removed by the low-pass filter 3 having a frequency response as shown in FIG. 2, and the low frequency components of the output signal of the uni-directional microphone 2 are removed by the high-pass filter 4 having a frequency response as shown in FIG. 2. The outputs of the two filters are summed up by the adder 5. FIG. 3 shows a frequency response of the microphone apparatus of FIG. 1. By the microphone apparatus of FIG. 1, the signal in the low frequency region is collected by the non-directional microphone, and the signal in high frequency region is collected by the uni-directional microphone. Therefore, it is possible to prevent reduction of the S/N ratio of the sound collection by reducing the acoustic noise in the high frequency region and vibration noise in the low frequency region generated by the mechanical system contained in an appliance in which the microphone apparatus is incorporated, as well as the wind noise.

Figure 4:
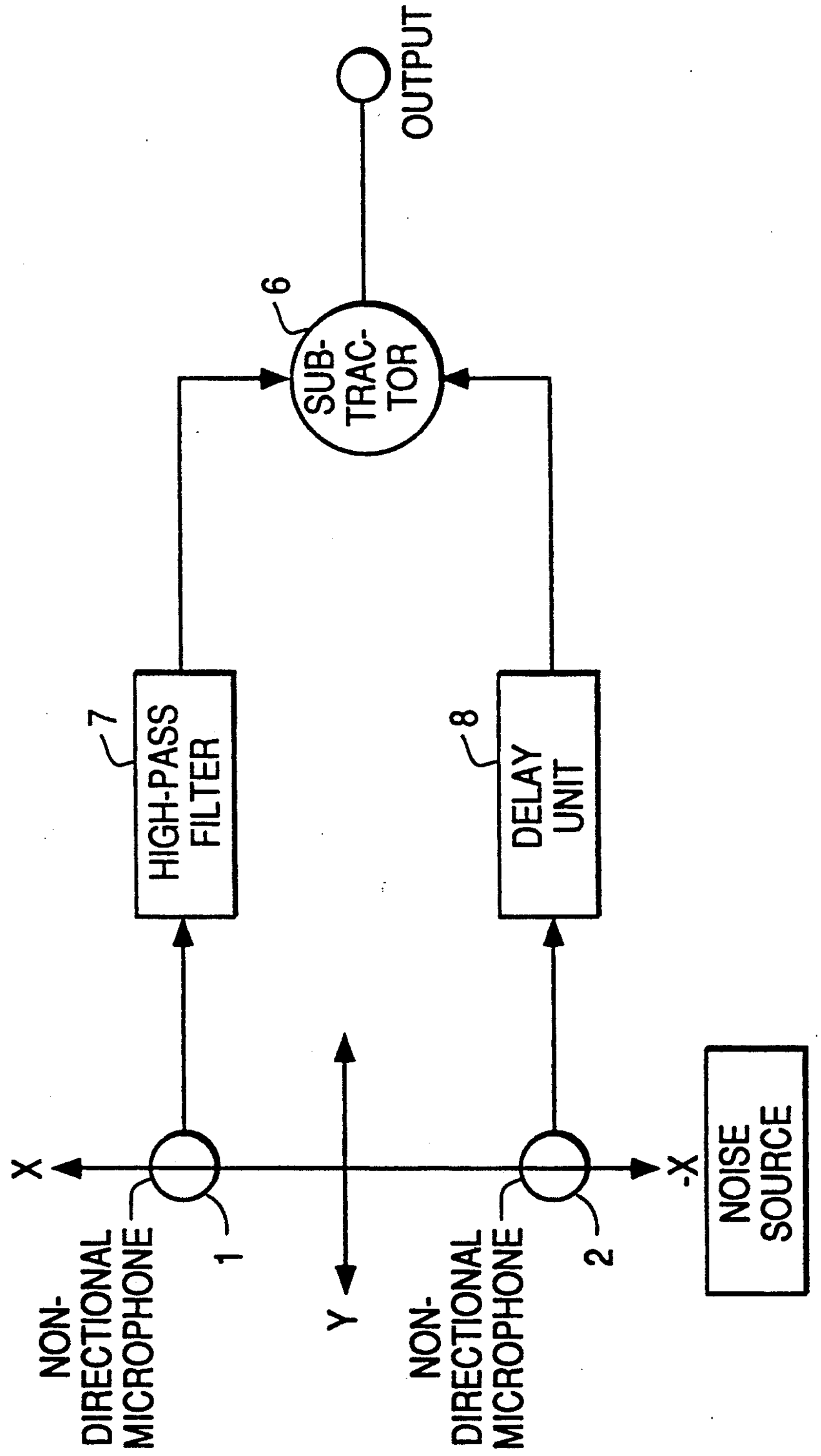
FIG. 4 is a block diagram showing a microphone apparatus in accordance with another embodiment of the present invention.

FIG. 4 is a block diagram of a microphone apparatus in accordance with another embodiment of the present invention. In FIG. 4, the X-direction is referred to as the front direction, the -X direction as the rear direction, and the Y-direction is referred to as the side direction. More specifically in FIG. 4, element 1 is a non-directional microphone; element 2 is a non-directional microphone disposed at a distance in the rear direction to the non-directional microphone 1 with the main axis aligned on a straight line with that of the non-directional microphone 1; element 8 is a delay unit for delaying an output signal of the non-directional microphone 2; element 7 is a high-pass filter for removing low frequency components of an output signal of the non-directional microphone 1, and 6 is a subtracter for subtracting an output signal of the delay unit 3 from an output signal of the high-pass filter 4.

In the thus composed microphone apparatus, the operation is as follows.

Figure 5:
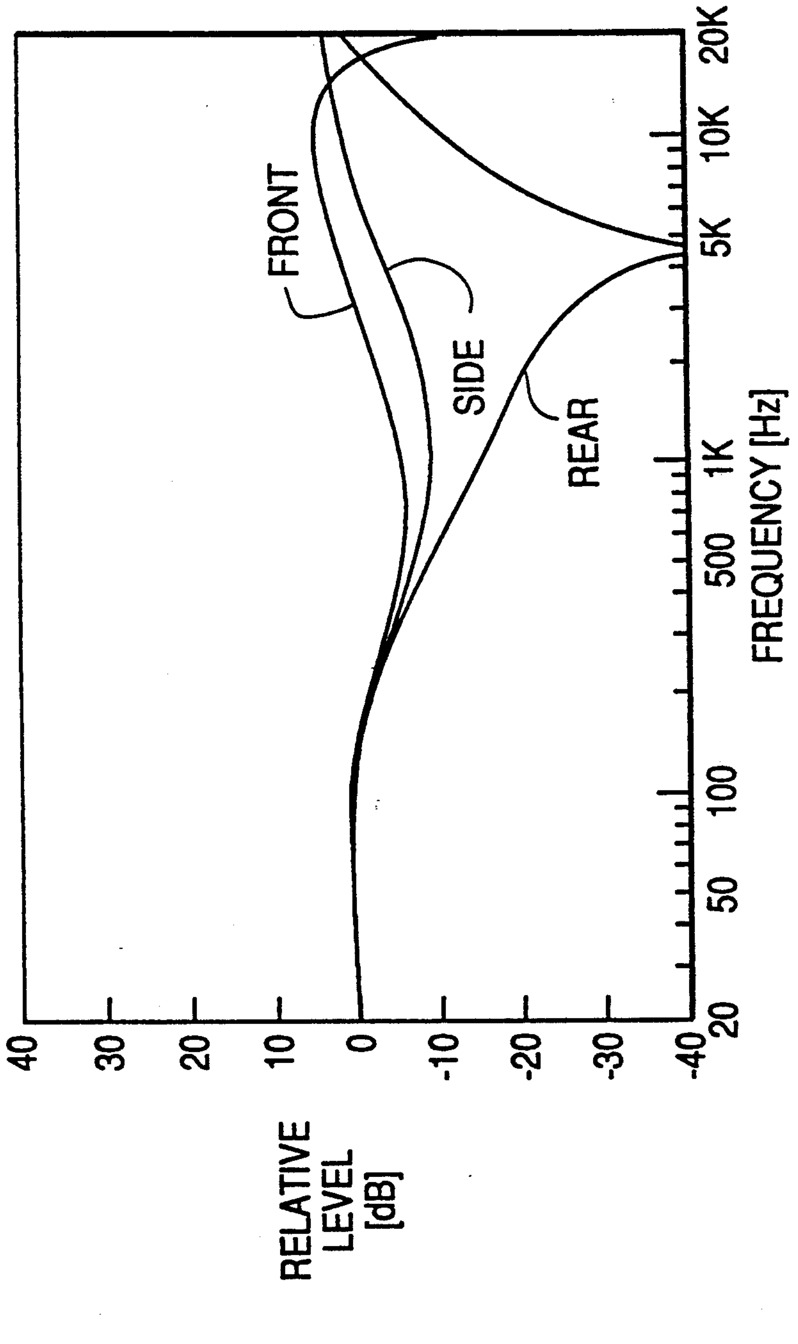
FIG. 5 is a diagram showing a frequency response of the microphone apparatus of FIG. 4.

The two non-directional microphones are disposed at a spacing therebetween, and the output signal of one non-directional microphone is delayed by a delay time corresponding to the distance between the two microphones. The delayed signal is subtracted for the output of the other non-directional microphone, so that the same directional characteristic as that of a uni-directional microphone can be obtained. Accordingly, the output signal of the non-directional microphone 2 is delayed by the delay unit 8. The delayed signal from the delay unit 8 is combined with the output signal of the non-directional microphone 1 which has had its low frequency components removed by the high-pass filter 7, so that only the high frequency components are made uni-directional. FIG. 5 shows a frequency response of the microphone apparatus of FIG. 4.

According to the characteristic as shown in FIG. 5, the microphone apparatus of FIG. 4 can, in the same fashion as that of the preceding embodiment, reduce the acoustic noise in the high frequency region and vibration noise in the low frequency region generated by the mechanical system contained in an appliance in which the microphone apparatus is incorporated, and can reduce the wind noise, thereby preventing a reduction of the S/N ratio when collecting sound.

What is claimed is:

1. A microphone apparatus comprising:

a first non-directional microphone;

a second non-directional microphone disposed at a distance to the first non-directional microphone so that main axes of the first and second non-directional microphones are aligned on a straight line;

a delay unit for delaying an output signal of the second non-directional microphone;

a high-pass filter for removing low frequency components of an output signal of the first non-directional microphone; and a subtracter for subtracting an output signal of the delay unit from an output signal of the high-pass filter.

* * * * *